(12) United States Patent
Ishii et al.

(10) Patent No.: US 9,331,225 B2
(45) Date of Patent: May 3, 2016

(54) SOLAR CELL MODULE

(71) Applicant: Sanyo Electric Co., Ltd., Moriguchi, Osaka (JP)

(72) Inventors: Yosuke Ishii, Izumiotsu (JP); Daisuke Ide, Kobe (JP); Youhei Murakami, Izumisano (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 308 days.

(21) Appl. No.: 13/972,328

(22) Filed: Aug. 21, 2013

(65) Prior Publication Data

US 2013/0333743 A1    Dec. 19, 2013

Related U.S. Application Data

(63) Continuation of application No. PCT/JP2012/051165, filed on Jan. 20, 2012.

(30) Foreign Application Priority Data

Feb. 28, 2011   (JP) .................................. 2011-042133

(51) Int. Cl.
*H01L 31/0224*   (2006.01)
*H01L 31/05*   (2014.01)
*H01L 31/068*   (2012.01)

(52) U.S. Cl.
CPC .... *H01L 31/0516* (2013.01); *H01L 31/022441* (2013.01); *H01L 31/0682* (2013.01); *Y02E 10/547* (2013.01)

(58) Field of Classification Search
CPC ............ H01L 31/0516; H01L 31/0682; H01L 31/0465; H01L 31/0508
See application file for complete search history.

(56) References Cited

U.S. PATENT DOCUMENTS

| | | | |
|---|---|---|---|
| 2009/0032081 A1* | 2/2009 | Saita et al. ..................... | 136/244 |
| 2010/0294349 A1* | 11/2010 | Srinivasan et al. ............. | 136/255 |
| 2011/0073165 A1* | 3/2011 | Lee ................................ | 136/251 |

FOREIGN PATENT DOCUMENTS

| | | |
|---|---|---|
| JP | H02-235379 A | 9/1990 |
| JP | 2005-191479 A | 7/2005 |
| JP | 2009-266848 A | 11/2009 |
| JP | 2010-108994 A | 5/2010 |

\* cited by examiner

*Primary Examiner* — Jayne Mershon

(74) *Attorney, Agent, or Firm* — Marvin A. Motsenbocker; MOTS LAW, PLLC

(57) ABSTRACT

The present invention improves the reliability of back contact solar cell modules that are electrically connected by means of wiring material. A solar cell module (1) is provided with a plurality of solar cells (10), and wiring material (11). Each solar cell (10) has a p-side electrode (15) and an n-side electrode (14) arranged on a single main surface (20*a*). Among adjacent solar cells (10), the wiring material (11) electrically connects the p-side electrode (15) of one solar cell (10) to the n-side electrode (14) of another solar cell (10). The surface layers of the p-side electrode (15) and the n-side electrode (14) include plating layers (16*c*, 17*c*) which have at least one power supply point (18, 19). The wiring material (11) is bonded to the plating layers such that the wiring material overlaps a portion of the power supply points (18, 19) of each solar cell (10), and does not overlap another portion of the power supply points (18, 19).

16 Claims, 5 Drawing Sheets

SOLAR CELL MODULE

CROSS-REFERENCE TO RELATED APPLICATIONS

This is a continuation of International Application PCT/JP2012/051165, with an international filing date of Jan. 20, 2012, filed by applicant, the disclosure of which is hereby incorporated by reference in its entirety.

FIELD OF THE INVENTION

The present invention relates to a solar cell module. More specifically, the present invention relates to a solar cell module having a plurality of back contact solar cells that are electrically connected by means of wiring material.

BACKGROUND

Solar cells have attracted much attention in recent years as an energy source with a low environmental impact. As a result, research and development in the field of solar cells has been active. The most important issue has been to improve the conversion efficiency of solar cells. Therefore, a considerable amount of research and development has been directed at solar cells and manufacturing methods for solar cells with improved conversion efficiency.

For example, a solar cell with high conversion efficiency has been proposed in Patent Document 1. This solar cell is a so-called back contact solar cell in which the p-type region and n-type region are both formed on the back surface. A back contact solar cell does not require electrodes on the light-receiving surface to collect carriers. As a result, the light-receiving efficiency can be improved with back contact solar cells, and thus improved conversion efficiency may be realized.

Patent Document 1 describes the configuration of a solar cell module in which a plurality of back contact solar cells has been electrically connected by means of wiring material. In this solar cell module, the solar cells are electrically connected by the wiring material only on the back surface. As a result, wiring material with a greater width can be used. This can suppress any voltage drop caused by the use of wiring to connect a plurality of solar cells.

CITED DOCUMENTS

Patent Documents

Patent Document 1: Laid-Open Patent Publication No. 2009-266848

SUMMARY

Problem Solved by the Invention

In a solar cell module using a plurality of back contact solar cells, all of the wiring is formed on the back surface of the solar cells. As a result, when thermal expansion caused by a rise in temperature in the solar cell module generates stress, all of the stress applied to the solar cells from the wiring due to the difference in thermal expansion coefficients is applied to the back surface of the solar cell. Therefore, it is more important in a solar cell module using back contact solar cells than in conventional solar cell modules to improve the reliability of the junctions between the wiring and the solar cells.

In view of this situation, it is an object of the present invention to improve the reliability of back contact solar cell modules that are electrically connected by means of wiring material.

Means of Solving the Problem

The solar cell module of the present invention is provided with a plurality of solar cells and wiring material. The plurality of solar cells have a p-side electrode and an n-side electrode arranged on a single main surface. Among adjacent solar cells, the wiring material electrically connects the p-side electrode of one solar cell to the n-side electrode of another solar cell. The surface layers of the p-side electrode and the n-side electrode, respectively, include plating layers which have at least one power supply point. The wiring material is bonded to the plating layers so that the wiring material overlaps a portion of the power supply points of each solar cell, and does not overlap another portion of the power supply points.

Effect of the Invention

The present invention is able to improve the reliability of back contact solar cells modules that are electrically connected by means of wiring material.

DETAILED DESCRIPTION

Figure 1:
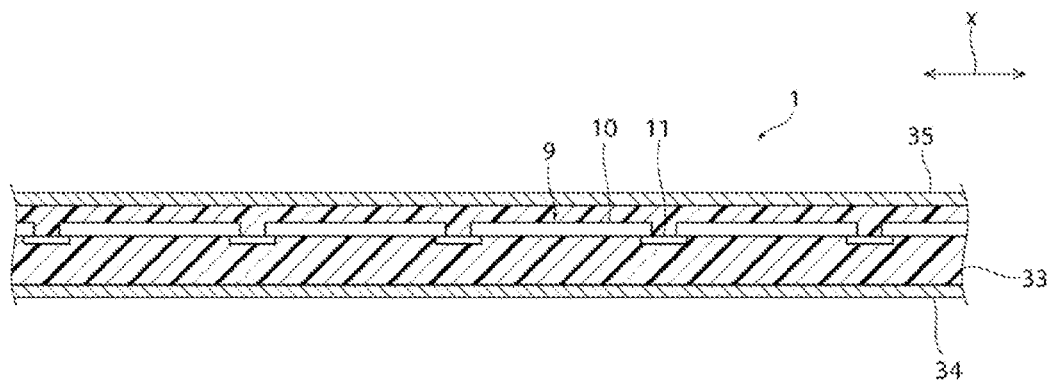
FIG. 1 is a simplified cross-sectional view of a solar cell module in the first embodiment.

The following is an explanation of preferred embodiments of the present invention. The following embodiments are merely illustrative. The present invention is not limited to these embodiments.

Further, in each of the drawings referenced in the embodiments, members having substantially the same function are denoted by the same symbols. The drawings referenced in the embodiments are also depicted schematically, and the dimensional ratios of the objects depicted in the drawings may differ from those of the actual objects. The dimensional ratios of objects may also vary between drawings. The specific dimensional ratios of the objects should be determined with reference to the following explanation.

1st Embodiment

Basic Configuration of Solar Cell Module 1

Solar cell module 1 is provided with a solar cell string 9. The solar cell string 9 is provided with a plurality of back contact solar cells 10 arranged in one direction (the x direction). The plurality of solar cells 10 are electrically connected by means of a wiring material 11. More specifically, the plurality of solar cells 10 are electrically connected in series or in parallel by electrically connecting adjacent solar cells 10 to each other by means of wiring material 11.

A light-receiving surface protecting member 35 is arranged on the light-receiving surface side of the solar cell string 9. A back surface protecting member 34 is arranged on the back side of the solar cell string 9. Sealing material 33 is provided between the protecting members 34, 35. The solar cell string 9 is sealed inside the sealing material 33.

There are no particular restrictions on the sealing material 33 and on the materials used in the protecting members 34, 35. The sealing material 33 can be molded from a resin such as an ethylene-vinyl acetate copolymer (EVA) or polyvinyl butyral (PVB).

The light-receiving surface protecting member 35 can be, for example, a transparent panel such as a glass plate or resin panel. The back surface protecting member 34 can be, for example, a metal foil such as aluminum foil interposed between sheets of resin film, a glass plate, or a resin panel.

(Structure of Solar Cells 10)

Figure 2:
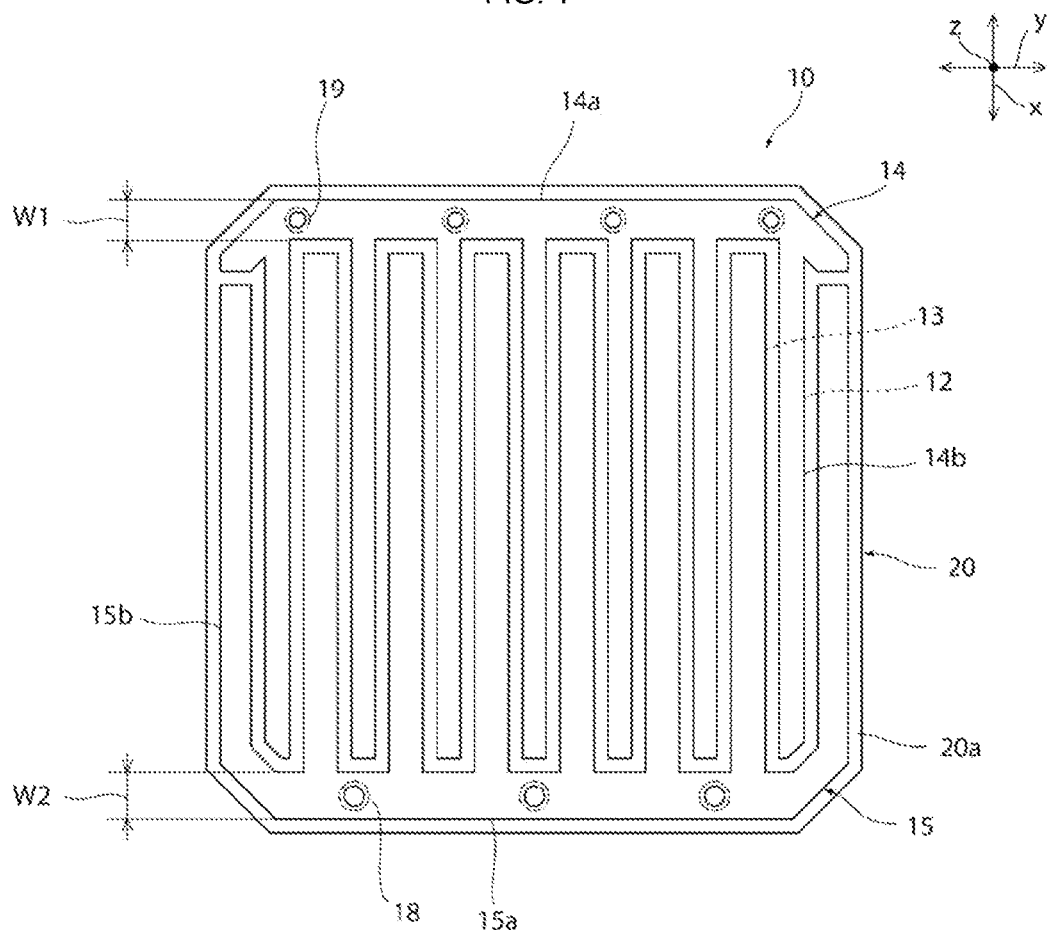
FIG. 2 is a simplified plan view of a solar cell in the first embodiment.

As shown in FIG. 2, solar cells 10 have a photoelectric conversion unit 20. There are no particular restrictions on the photoelectric conversion unit 20 as long as the received light generates carriers (electrons and holes). The photoelectric conversion unit 20 may be provided with, for example, a crystalline semiconductor substrate having one type of conductivity, and a p-type and n-type amorphous semiconductor layer arranged on top of one surface of the substrate. In the photoelectric conversion unit, an i-type amorphous semiconductor layer thick enough not to contribute substantially to the generation of electricity may be interposed between the substrate and the p-type and n-type amorphous semiconductor layers, respectively.

Also, the photoelectric conversion unit 20 may have a p-type dopant diffusing portion and n-type dopant diffusing portion exposed on one surface of a substrate comprising a crystalline semiconductor having one type of conductivity. The photoelectric conversion unit 20 may be, for example, a compound semiconductor or organic semiconductor.

In the embodiment explained below, the photoelectric conversion unit 20 has an n-type crystalline semiconductor substrate and p-type and n-type amorphous semiconductor layers arranged on one main surface of the substrate.

The photoelectric conversion unit 20 has a back surface 20a and a light-receiving surface 20b. Light-blocking structures such as metal electrodes are not provided on the light-receiving surface 20b in the solar cells 10 of the present embodiment. Therefore, light can be received over the entire light-receiving surface 20b. In the solar cells 10, a passivation layer and/or an anti-reflective layer may be formed on the light-receiving surface 20b. This enables the photoelectric conversion efficiency of the solar cells 10 to be improved. The light-receiving surface 20b preferably has a textured structure to reduce the reflection of light. This enables the photoelectric conversion efficiency to be improved even further.

An n-type surface 12 and p-type surface 13 are included in the rear surface 20a. In the present embodiment, the n-type surface 12 is formed from the surface of an n-type amorphous semiconductor layer provided on the crystalline semiconductor substrate. The p-type surface 13 is formed from the surface of a p-type amorphous semiconductor layer provided on the crystalline semiconductor substrate. When an n-type region containing an n-type dopant and a p-type region containing a p-type dopant are provided on the crystalline semiconductor substrate in the photoelectric conversion unit, the n-type surface is formed from the surface of the n-type region and the p-type surface is formed from the surface of the p-type region.

An n-side electrode 14 is provided on the n-type surface 12, and the n-side electrode 14 is electrically connected to the n-type surface 12. The p-side electrode 15 is provided on the p-type surface 13, and the p-side electrode 15 is electrically connected to the p-type surface 13. The n-side electrode 14 and p-side electrode 15 collect electrons and holes, respectively. In the present embodiment, an n-type crystalline semiconductor substrate is used. Therefore, electrons are majority carriers, and holes are the minority carriers.

Both the n-side electrode 14 and the p-side electrode 15 are comb-shaped. The teeth of the n-side electrode 14 and the teeth of the p-side electrode 15 are intermeshed.

More specifically, both the n-side electrode 14 and the p-side electrode 15 have busbar portions 14a, 15a extending in the direction (y direction) perpendicular to the one direction (x direction), and a plurality of finger portions 14b, 15b extending from the busbar portions 14a, 15a in the x direction. The plurality of busbar portions 14b, 15b are arranged at predetermined intervals in the y direction with respect to each other. The finger portions 14b, 15b are electrically connected to their respective busbar portions 14a, 15a.

The width W1 of the busbar portion 14a in the y direction constituting a portion of the n-side electrode 14 collecting the majority carrier is preferably smaller than the width W2 of the busbar portion 15a in the y direction constituting a portion of the p-side electrode 15 collecting the minority carrier. In other words, the width W1 of busbar portion 14a is preferably smaller than the width W2 of busbar portion 15a.

Figure 4:
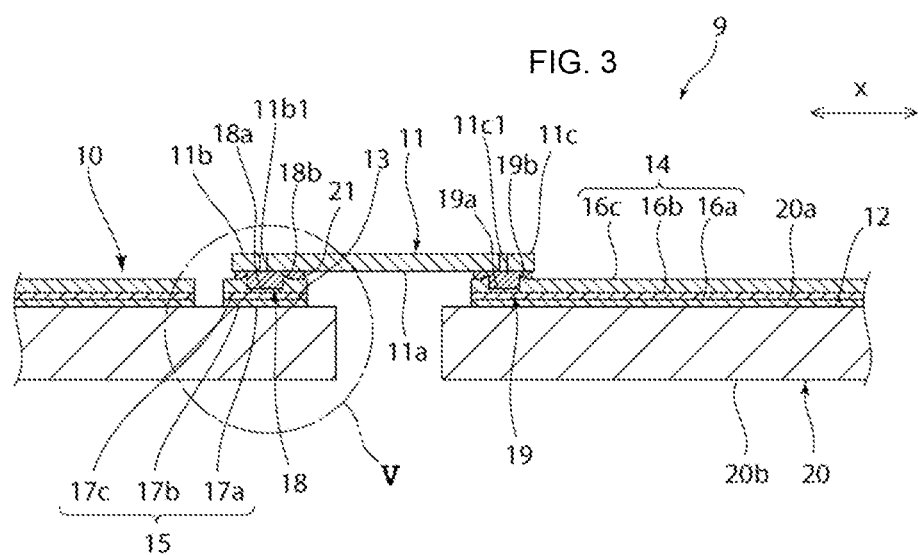
FIG. 4 is a simplified cross-sectional view of line IV-IV in FIG. 3.

The surface of the n-side electrode 14 and/or the p-side electrode 15 includes a plating layer. The plating layer may be formed over the entire surface of the n-side electrode 14 and/or the p-side electrode 15. In the present embodiment, as shown in FIG. 4, both the n-side electrode 14 and the p-side electrode 15 are laminates comprising at least conductive layers 16b, 17b, and plating layers 16c, 17c formed on top of conductive layers 16b, 17b.

When the n-type surface 12 and the p-type surface 13 are a amorphous semiconductor, transparent conductive oxide (TCO) layers 16a, 17a may be provided below the conductive layers 16b, 17b of both the n-side electrode 14 and the p-side electrode 15.

The TCO layers 16a, 17a can also be formed from an indium oxide containing, for example, a dopant such as indium tin oxide (ITO). The thickness of the TCO layers 16a, 17a can be from 20 nm to 200 nm.

The conductive layers 16b, 17b are used as underlying layers when the plating layers 16c, 17c are formed. The conductive layers 16b, 17b are also used to improve the adhesion of the plating layers 16c, 17c to the TCO layers 16a, 17a. The conductive layers 16b, 17b can be formed from a metal such as Cu, Sn, Ag, Au, Pt, Pd, Al, Ti and Ni, or an alloy containing at least one of these metals. The conductive layers 16b, 17b may be a laminate with a plurality of conductive layers. The thickness of the conductive layers 16b, 17b can be from 50 nm to 500 nm.

The plating layers 16c, 17c can be formed from a metal such as Cu or Sn, or an alloy containing at least one of these metals. The plating layers 16c, 17c can be a laminate with a plurality of plating layers. The thickness of the plating layers 16c, 17c can be from 2 nm to 50 µm.

In the present embodiment, the plating layers 16c, 17c are formed using electrolytic plating. Plating layers 16c, 17c have at least one power supply point 18, 19, respectively. More specifically, a plurality of power supply points 18, 19 are formed at equal intervals in plating layers 16c, 17c, respectively.

The power supply points 18, 19 are the points at which pressure from a power supply probe is applied when the plating layers 16c, 17c are formed. As a result, the power supply points 18, 19 have round central portions 18a, 19a in the plating layers 16c, 17c which are thinner than the other portions of the power supply points 18, 19. The power supply points 18, 19 also have ring-shaped protruding portions 18b, 19b positioned to the outside of the central portions 18a, 19a and surrounding the central portion 18a, 19a which are thicker than the other portions of the power supply points 18, 19. The thickness of the central portions 18a, 19a and the maximum thickness of the protruding portions 18b, 19b are preferably from 0 to 0.5 times and from 1.1 to 10 times, respectively, the thickness of the other portions of the power supply points 18, 19 in the plating films 16c, 17c. The thicknesses are more preferably 0 to 0.1 times and 1.1 to 5 times, respectively. The ratio of the maximum thickness of the protruding portions 18b, 19b to the thickness of the central portions 18a, 19a (the maximum thickness of the protruding portions 18b, 19b divided by the thickness of the central portions 18a, 19a) is 2.2 or greater, and preferably 11 or greater. The depth from the tip of the protruding portions 18b, 19b to the central portions 18a, 19a is from 5 µm to 100 µm, and preferably from 10 µm to 50 µm. The diameter of the central portions 18a, 19a is from 1 mm to 5 mm, and preferably from 2 mm to 3 mm. The width of the protruding portions 18b, 19b in the radial direction is from 0.01 mm to 1 mm, and preferably from 0.1 mm to 0.5 mm.

The shape of the power supply points in the present invention does not have to be round. The shape of the power supply points reflects the shape of the tip of the power supply probe, and thus can be polygonal or triangular.

(Electrical Connection of Solar Cells 10 Using Wiring Material 11)

The following is a detailed explanation of the electrical connection of the solar cells 10 in the present embodiment.

Figure 3:
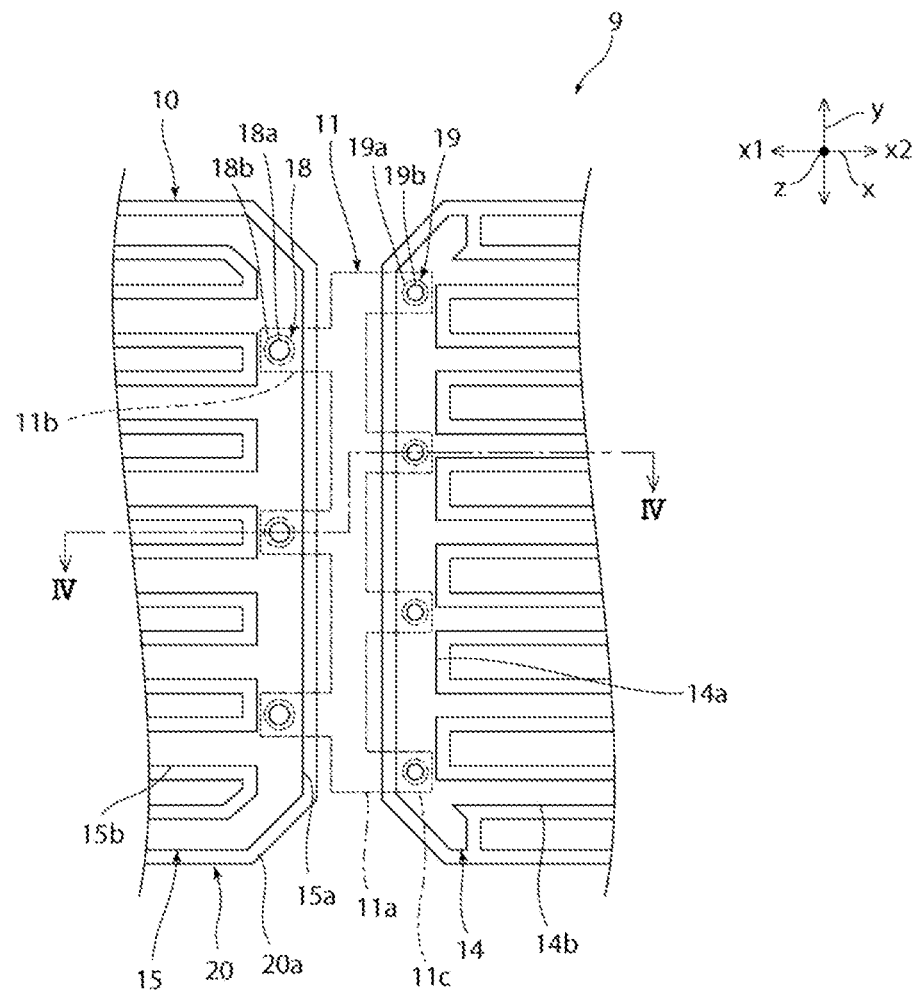
FIG. 3 is a simplified plan view showing a portion of a solar cell string in the first embodiment.
Figure 5:
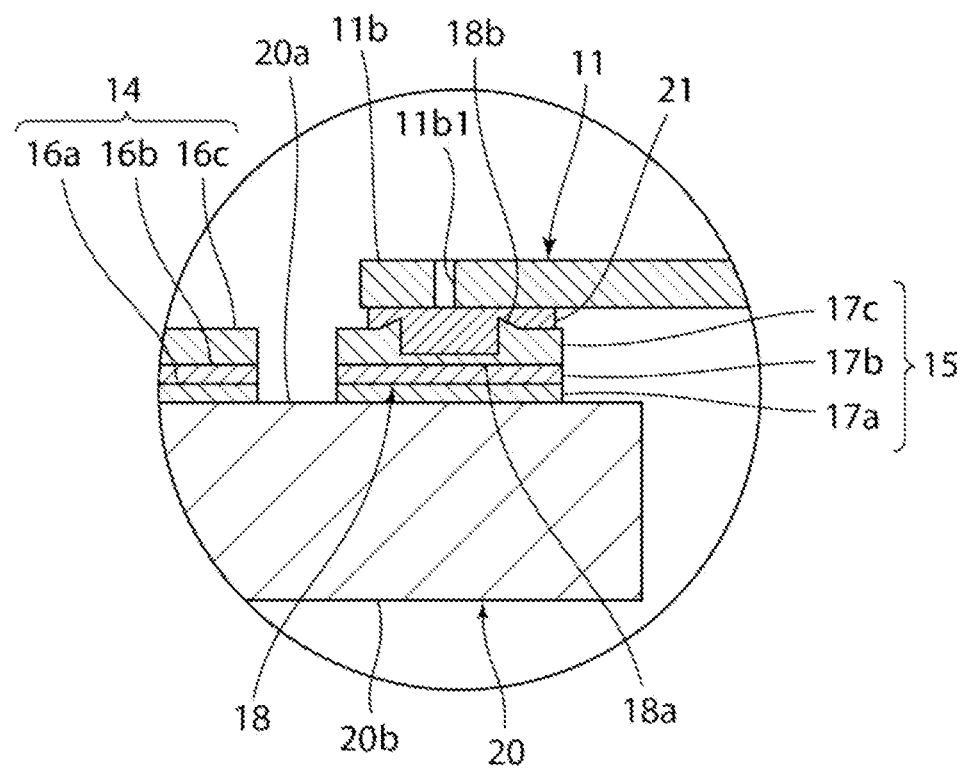
FIG. 5 is a simplified cross-sectional view in which portion V in FIG. 4 has been enlarged.

As shown in FIG. 3 through FIG. 5, the wiring material 11 has a main portion 11a and first and second junctions 11b, 11c. The main portion 11a of the wiring material in the longitudinal direction extends in the y direction between adjacent solar cells 10. The the main portion 11a of the wiring material in the lateral direction extends in the x direction between adjacent solar cells 10. Each of the first and second junctions 11b, 11c extends in the x direction and is electrically connected to the main portion 11a of the wiring material. The main portion 11a of the wiring material has a width that prevents contact with the adjacent solar cells 10. As a result, the wiring material 11 only makes contact with the solar cells 10 via the first and second junctions 11b, 11c.

Between adjacent solar cells 10, the p-side electrode 15 of one solar cell 10 is electrically connected to the n-side electrode 14 of the other solar cell 10 by means of the wiring material 11. In the present embodiment, the wiring material 11 is joined by solder 21 so as to overlap some portions of the power supply points 18, 19 of the solar cells 10 and not overlap other portions of the power supply points 18, 19. More specifically, in the present embodiment, the first junction 11b of the wiring material 11 is provided so as to cover power supply point 18. An opening 11b1 is provided in the first junction 11b. Because of the opening 11b1, a portion of the power supply point 18 is not overlapped by the first junction 11b. More specifically, the wiring member is joined using solder 21 so that some of the central portion 18a of the power supply point 18 overlaps with the first junction 11b, and some of the central portion 18a does not overlap with the first junction 11b.

The second junction 11c of the wiring material 11 is provided so as to cover power supply point 19. An opening 11c1 is provided in the second junction 11c. Because of the opening 11c1, a portion of the power supply point 19 is not overlapped by the second junction 11c. More specifically, the wiring member is joined using solder 21 so that some of the central portion 19a of the power supply point 19 overlaps with the second junction 11c, and some of the central portion 19a does not overlap with the second junction 11c.

There are no particular restrictions on the wiring material 11 as long as it is a conductive material. The wiring material 11 can be a metal selected from among Cu, Ni and Sn, or an alloy containing at least one metal selected from among Cu, Ni and Sn.

The following is an explanation of an example of a manufacturing method for the solar cell module 1.

First, a plurality of photoelectric conversion units 20 is prepared. Next, TCO layers 16a, 17a and metal or metal alloy conductive layers 16b, 17b are formed on top of the n-type surface 12 and p-type surface 13 on the back surface 20a of the photoelectric conversion units 20.

Figure 6:
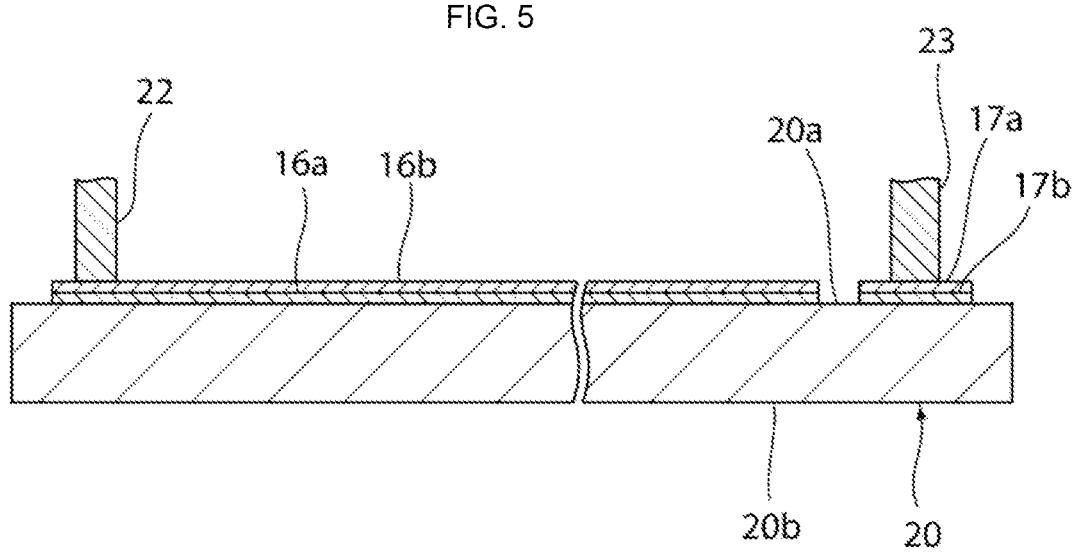
FIG. 6 is a simplified cross-sectional view used to explain the manufacturing process for the solar cell module in the first embodiment.

Next, as shown in FIG. 6, power supply probes 22, 23 are pressed into the conductive layers 16b, 17b, the unit is immersed in a plating bath, and power is supplied from the power supply probes 22, 23 to perform electrolytic plating and form the plating layers 16c, 17c. This completes the n-side electrode 14 and the p-side electrode 15.

In the formation process of plating layers 16c, 17c, the plating layer is not thick where the power supply probes 22, 23 were applied, but becomes thicker in the area surrounding where the power supply probes 22, 23 were applied. As a result, power supply points 18, 19 are formed.

Next, the first and second junctions 11b, 11c, having openings 11b1, 11c1 of the wiring material 11 are joined to the areas including the power supply points 18, 19 using solder 21 to connect a p-side electrode 15 and an n-side electrode 14. This is repeated to create a solar cell string 9.

A resin sheet such as an EVA sheet is placed over the light-receiving surface protecting member 35, and a plurality of solar cell strings 9 electrically connected by means of wiring are placed on top of the resin sheet. Another resin sheet such as an EVA sheet is placed on top thereof, and a back surface protecting member 34 is placed on top of the resin sheet. These are then subjected to heat and pressure in a reduced-pressure atmosphere to create a solar cell module 1.

In the present embodiment, as explained above, the wiring material 11 is bonded using solder 21 so as to overlap a portion of the power supply points 18, 19 in the solar cells 10. As a result, the protruding portions 18b, 19b are joined to the solder 21. In this way, the bonding strength of the wiring material 11 to the n-side or p-side electrodes 14, 15 can be increased. As a result, the reliability of the solar cell module 1 can be improved.

When openings 11b1, 11c1 are not provided in the wiring material 11, gaps (hereafter, "voids") may occur where there is no solder in the power supply points. The voids are created by gas inside the power supply points during the soldering process, and gases generated by the solder.

Thus, when voids occur in the power supply points, the strength of the joints created by the solder between the wiring material and the solar cells is reduced. The electrical resistance in the joined portions of the wiring material and the solar cells also increases. As a result, the photoelectric conversion efficiency of the solar cell module tends to decline.

In the present embodiment, the wiring material 11 is also bonded using solder 21 so as not to overlap a portion of the power supply points 18, 19 in the solar cells 10. As a result, the gases in the power supply points 18, 19 can be efficiently released from the portions of the power supply points 18, 19 not overlapping with the wiring material 11. As a result, the power supply points 18, 19 can be more reliably filled with solder 21, and the occurrence of voids can be prevented. Therefore, the strength of the joints created by the solder between the wiring material and the solar cells is increased. The electrical resistance in the junctions of the wiring material 11 and the solar cells is also reduced. Therefore, a solar cell module 1 with improved photoelectric conversion efficiency can be realized.

In the present embodiment, the openings 11b1, 11c1 are then filled with solder 21 to further increase the joint strength of the wiring material 11.

In the present embodiment, the wiring material 11 is discretely bonded with a plurality of areas including power supply points 18, 19. Compared to a situation in which the entire surface of the busbar portions 14a, 15a is bonded to the wiring material 11, the wiring material 11 in the present embodiment is less likely to be subjected to stress. This more effectively suppresses cracking of the wiring material 11. As a result, a more reliable solar cell module 1 can be realized.

In the present embodiment, the power supply points 18, 19 provided on the busbar portions 14a, 15a are thinner and have central portions 18a, 19a with higher electrical resistance. Compared to a situation in which the power supply points are provided on the finger portions, the placement of the power supply points in the present invention can more effectively suppress a reduction in photoelectric conversion efficiency.

In the present embodiment, solder 21 was used to connect the wiring material 11 to the busbar portions 14a, 15a. However, solder 21 does not have to be used to establish these connections. Instead of solder 21, the wiring material 11 may be connected to the busbar portions 14a, 15a using a conductive material with a bonding strength similar to that of solder 21.

The following is an explanation of other preferred embodiments of the present invention. In the following explanation, members having functions substantially similar to those in the first embodiment are denoted by the same reference numbers, and further explanation of these members has been omitted.

The second through sixth embodiments below have a configuration that is identical to the first embodiment except for the shape and placement of the wiring material 11 and power supply points 18, 19. As a result, the explanation of the first embodiment can be applied to these embodiments except for the portions explained below.

In the second through sixth embodiments, the configuration of the first junctions 11b and the second junctions 11c is substantially identical. The configuration of the power supply points 18, 19 is also substantially identical. The positional relationship between the first junctions 11b and the power supply points 18 is similar to the positional relationship between the second junctions 11c and the power supply points 19. Therefore, FIG. 7 through FIG. 11, which show the first junctions 11b and the power supply points 18, can be applied to the second junctions 11c and the power supply points 19.

2nd Embodiment

Figure 7:
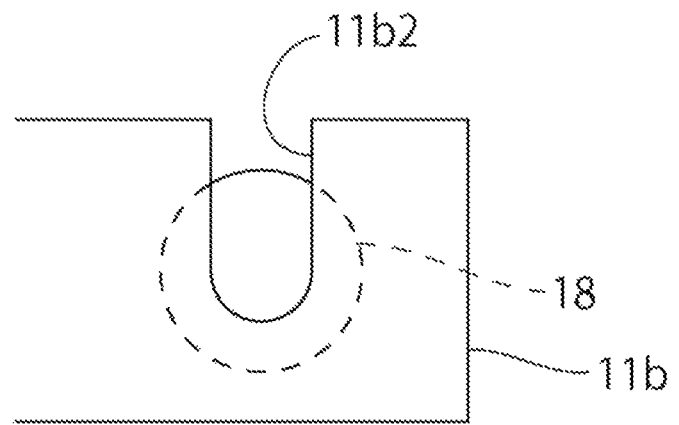
FIG. 7 is a schematic plan view used to explain the positional relationship between the wiring material and a power supply point in the second embodiment.

FIG. 7 is a schematic plan view used to explain the positional relationship between the wiring material and power supply points in the second embodiment.

In the present embodiment, notches 11b2 are formed instead of the openings 11b1 in the first embodiment. In this way, the wiring material 11 does not overlap a portion of the power supply points 18, 19. As in the case of the first embodiment, this can be used to provide greater reliability and improved photoelectric conversion efficiency.

3rd Embodiment

Figure 8:
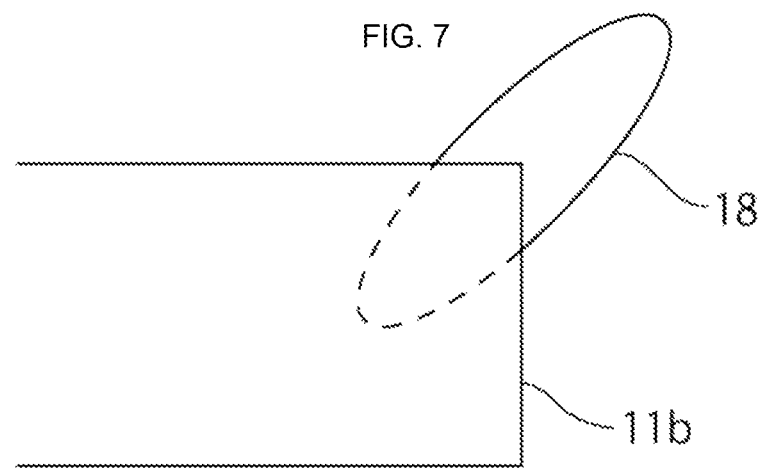
FIG. 8 is a schematic plan view used to explain the positional relationship between the wiring material and a power supply point in the third embodiment.

FIG. 8 is a schematic plan view used to explain the positional relationship between the wiring material and power supply points in the third embodiment.

In the present embodiment, the junctions 11b, 11c are rectangular and provided so that the elongated power supply points 18, 19 protrude from the junctions 11b, 11c. As in the case of the first embodiment, this can be used to provide greater reliability and improved photoelectric conversion efficiency. Also, compared to a situation in which the wiring material 11 has openings or notches, the wiring material 11 in the present invention is more rigid.

The power supply points in the present embodiment do not have to have a round shape.

4th Embodiment

Figure 9:
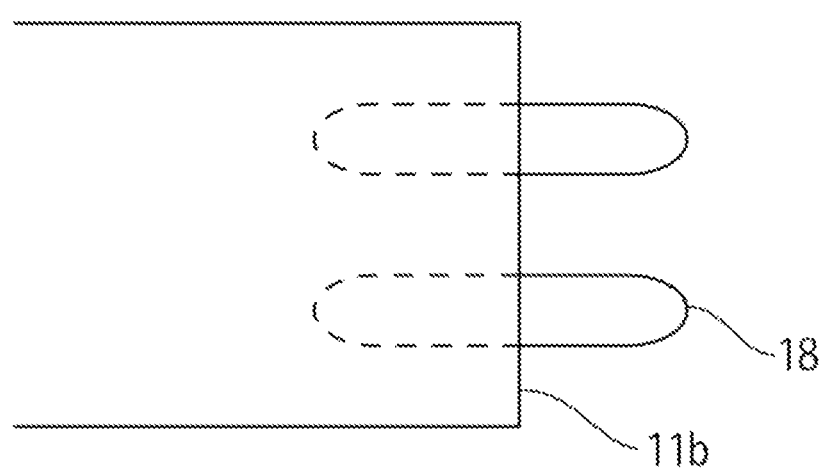
FIG. 9 is a schematic plan view used to explain the positional relationship between the wiring material and a power supply point in the fourth embodiment.

FIG. 9 is a schematic plan view used to explain the positional relationship between the wiring material and power supply points in the fourth embodiment.

In the present embodiment, a plurality of elongated power supply points 18, 19 are arranged parallel to the direction in which the junctions 11b, 11c extend, and the tips of the power supply points 18, 19 do not overlap with the wiring material 11. As in the case of the first embodiment, this can be used to provide greater reliability and improved photoelectric conversion efficiency.

5th Embodiment

Figure 10:
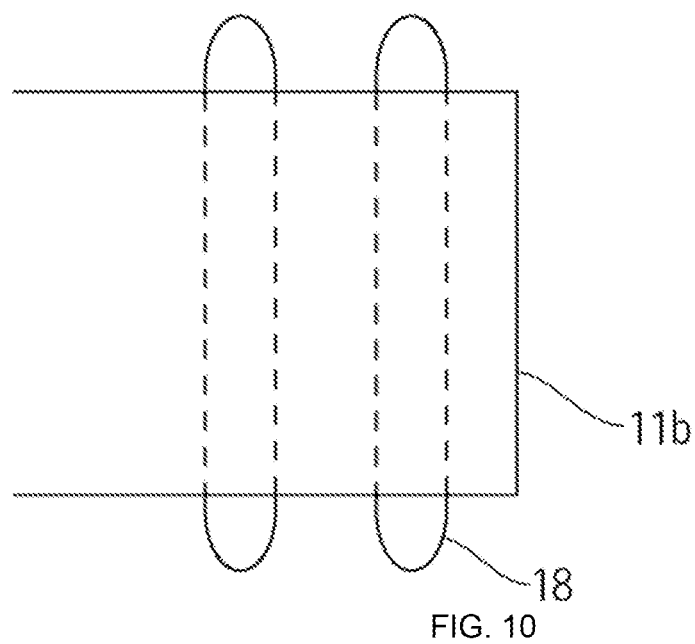
FIG. 10 is a schematic plan view used to explain the positional relationship between the wiring material and a power supply point in the fifth embodiment.

FIG. 10 is a schematic plan view used to explain the positional relationship between the wiring material and power supply points in the fifth embodiment.

In the present embodiment, a plurality of elongated power supply points 18, 19 are arranged in an inclined direction with respect to the direction in which the junctions 11b, 11c extend. More specifically, the plurality of elongated power supply points 18, 19 are arranged in the direction perpendicular to the direction in which the junctions 11b, 11c extend. As in the case of the first embodiment, this can be used to provide greater reliability and improved photoelectric conversion efficiency.

6th Embodiment

Figure 11:
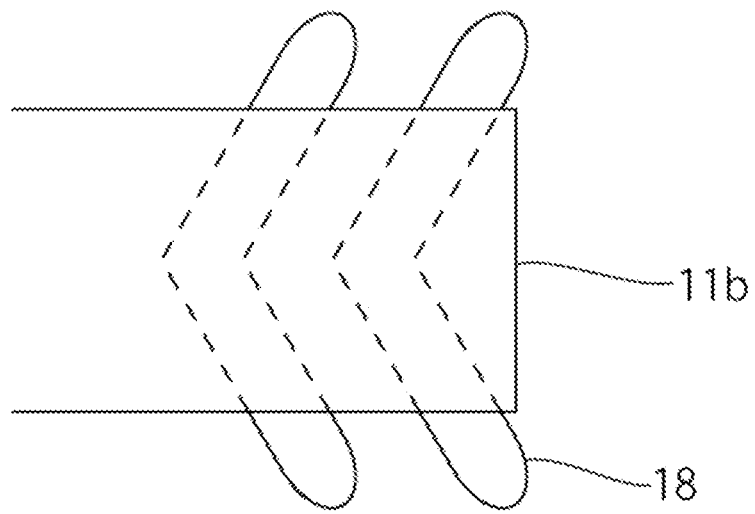
FIG. 11 is a schematic plan view used to explain the positional relationship between the wiring material and a power supply point in the sixth embodiment.

FIG. 11 is a schematic plan view used to explain the positional relationship between the wiring material and power supply points in the sixth embodiment.

In the present invention, the power supply points 18, 19 have a plurality of portions extending in an inclined direction with respect to each other. More specifically, the power supply points 18, 19 are V-shaped. The power supply points can also be U-shaped. As in the case of the first embodiment, this can be used to provide greater reliability and improved photoelectric conversion efficiency.

Other Variations

In the explanation of the first embodiment, each of the n-side electrodes 14 and p-side electrodes 15 has a plurality of finger portions 14*b*, 15*b* and busbar portions 14*a*, 15*a*, respectively. However, the present invention is not restricted to this configuration. In the present invention, the n-side electrode and/or p-side electrode does not have to have a busbar. It can be a so-called busbarless electrode with a plurality of finger portions.

In the explanation of the first embodiment, the wiring material 11 is formed in a zigzag pattern. However, the present invention is not restricted to this pattern. The wiring material in the present invention can also be linear.

In the explanation of the first embodiment, the power supply points 18, 19 were formed in the busbar portions 14*a*, 15*a*. However, the positioning of the power supply points in the present invention is not limited to this example. The power supply points can also be formed in the finger portions.

KEY TO THE DRAWINGS

1: solar cell module
10: solar cell
11: wiring material
11*b*: 1st junction
11*c*: 2nd junction
11*b*1, 11*c*1: openings
11*b*2: notch
12: n-type surface
13: p-type surface
14: n-side electrode
15: p-side electrode
14*a*, 15*a*: busbar portions
14*b*, 15*b*: finger portions
16*c*, 17*c*: plating layers
18, 19: power supply points
18*a*, 19*a*: central portions
18*b*, 19*b*: protruding portions
21: solder
22, 23: power supply probe

What is claimed is:

1. A solar cell module provided with a plurality of solar cells having a p-side electrode and an n-side electrode arranged on one main surface, and wiring material electrically connecting the p-side electrode of one solar cell to the n-side electrode of another adjacent solar cell;

each surface layer of the p-side electrode and the n-side electrode including a plating layer having at least one power supply point; and the wiring material being bonded to each plating layer such that the wiring material overlaps a portion of the power supply point of each solar cell, and does not overlap another portion of the power supply point and wherein the power supply point has a central portion that is thinner than other portions, and a protruding portion positioned to the outside of the central portion that is thicker than the other portions.

2. The solar cell module according to claim 1, wherein the wiring material is bonded to the plating layer using solder.

3. The solar cell module according to claim 1, wherein the wiring material has an opening or notch arranged in the location overlapping a portion of the power supply point.

4. The solar cell module according to claim 3, wherein the opening of the wiring material is located over the center of the portion of the power supply point that is not overlapped with the wring material.

5. The solar cell module according to claim 1, wherein the power supply point is provided so as to straddle the wiring material.

6. The solar cell module according to claim 1, wherein the power supply point has a portion extending in an inclined direction relative to the direction in which a junction of the wiring material and the solar cell extends.

7. The solar cell module according to claim 1, wherein the power supply point has a plurality of portions extending in an inclined direction relative to each other.

8. The solar cell module according to claim 1, wherein the power supply point is U-shaped or V-shaped.

9. The solar cell module according to claim 1, wherein the power supply point has a portion extending parallel to the direction in which a junction of the wiring material and the solar cell extends.

10. The solar cell module according to claim 1, wherein a plurality of power supply points is provided such that a portion of each power supply point overlaps a single junction of the wiring material and the solar cell.

11. The solar cell module according to claim 1, wherein the p-side electrode and n-side electrode have a busbar portion and a plurality of finger portions extending from the busbar portion, respectively, the power supply point being formed in the busbar portion.

12. The solar cell module according to claim 1, wherein the power supply point is circular and the portion of the power supply point that is not overlapped with wiring material is a central hole in the point supply point.

13. The solar cell module according to claim 12, wherein the protruding portion has an annular tip and the depth from the annular tip of the protruding portion to the central portion is from 5 microns to 100 microns.

14. The solar cell module according to claim 12, wherein the diameter of the central hole is from 1 millimeter to 5 millimeters.

15. The solar cell module according to claim 1, wherein the protruding portion in the radial direction has a width of between 0.1 millimeters to 0.5 millimeters.

16. The solar cell module according to claim 1, wherein the wiring material has an opening that is centrally positioned over the power supply central portion.

\* \* \* \* \*